(12) United States Patent
Sheu et al.

(10) Patent No.: US 8,014,194 B2
(45) Date of Patent: Sep. 6, 2011

(54) PHASE CHANGE MEMORY

(75) Inventors: Shyh-Shyuan Sheu, Taichung (TW); Pei-Chia Chiang, Taipei (TW); Wen-Pin Lin, Changhua County (TW)

(73) Assignees: Nanya Technology Corporation, Taoyuan (TW); Winbond Electronics Corp, Hsinchu (TW)

( * ) Notice: Subject to any disclaimer, the term of this patent is extended or adjusted under 35 U.S.C. 154(b) by 227 days.

(21) Appl. No.: 12/561,245

(22) Filed: Sep. 16, 2009

(65) Prior Publication Data

US 2010/0165722 A1    Jul. 1, 2010

(30) Foreign Application Priority Data

Dec. 30, 2008 (TW) ................. 97151370 A (51) Int. Cl.
*G11C 11/00* (2006.01)

(52) U.S. Cl. ......................... 365/163; 365/148; 365/210

(58) Field of Classification Search ............. 365/163, 365/148, 210, 151, 158, 189.09, 189.07, 365/189.16
See application file for complete search history.

(56) References Cited

U.S. PATENT DOCUMENTS

| | | | |
|---|---|---|---|
| 2009/0052233 A1* | 2/2009 | Nakai | 365/163 |
| 2010/0169740 A1* | 7/2010 | Jagasivamani et al. | 714/763 |

* cited by examiner

*Primary Examiner* — Dang Nguyen (57) ABSTRACT

A phase change memory (PCM) in which the phase change storage element is crystallized by a gradually increasing/decreasing operating current. The PCM comprises a switching circuit, the phase change storage element, a bit select switch, a pulse generating module, and a counting module. The switching circuit comprises a plurality of switches, selectively providing branch paths to an output terminal of a current source. The bit select switch controls the conduction between the phase change storage element and the output terminal of the current source. The pulse generating module outputs a pulse signal oscillating between high and low voltage levels. When enabled, the counting module counts the oscillations of the pulse signal, and outputs the count result by a set of digital data. The set of digital data are coupled to the switching circuit to control the switches therein.

7 Claims, 8 Drawing Sheets

PHASE CHANGE MEMORY

CROSS REFERENCE TO RELATED APPLICATIONS

This Application claims priority of Taiwan Patent Application No. 097151370, filed on Dec. 30, 2008, the entirety of which is incorporated by reference herein.

BACKGROUND

1. Technical Field

The present disclosure relates to phase change memories (PCMs).

2. Description of the Related Art

Phase change materials have at least two phases: a crystalline phase and an amorphous phase. A phase change memory, uses phase change materials as storage elements therein (hereinafter named phase change storage elements). A crystalline phase is represented as logic '0' and an amorphous phase is represented as logic '1'.

The transformation between the crystalline phase and the amorphous phase is controlled by an operating current flowing through the phase change storage element. Table 1 is a comparison of operating current for a crystalline phase and an amorphous phase.

TABLE 1

Comparison of operating current for a crystalline phase and an amorphous phase.

| | operating current (in pulse form, oscillating between high and low voltage levels) | |
|---|---|---|
| | magnitude | duty period |
| crystalline phase | Low | Long |
| amorphous phase | High | Short |

Achieving complete crystallization is difficult. For example, an inappropriate operating current may result in incomplete crystallization, which affects reliability of the phase change storage element.

BRIEF SUMMARY

The disclosure presents phase change memories, comprising a switching circuit routing branch currents, a phase change storage element, a bit select switch, a pulse generating module and a counting module. The switching circuit comprises a plurality of switches, selectively providing branch paths to an output terminal of a current source. The bit select switch controls the conduction between the phase change storage element and the output terminal of the current source. The pulse generating module outputs a pulse signal oscillating between high and low voltage levels. When enabled, the counting module counts the oscillations of the pulse signal, and outputs the count result by a set of digital data. The set of digital data are coupled to the switching circuit to control the switches therein.

A detailed description is given in the following embodiments with reference to the accompanying drawings.

BRIEF DESCRIPTION OF THE DRAWINGS

The present disclosure can be more fully understood by reading the subsequent detailed description and examples with references made to the accompanying drawings, wherein.

DETAILED DESCRIPTION

The following description shows several exemplary embodiments carrying out the disclosure. This description is made for the purpose of illustrating the general principles of the disclosure and should not be taken in a limiting sense. The scope of the disclosure is best determined by reference to the appended claims.

Figure 1:
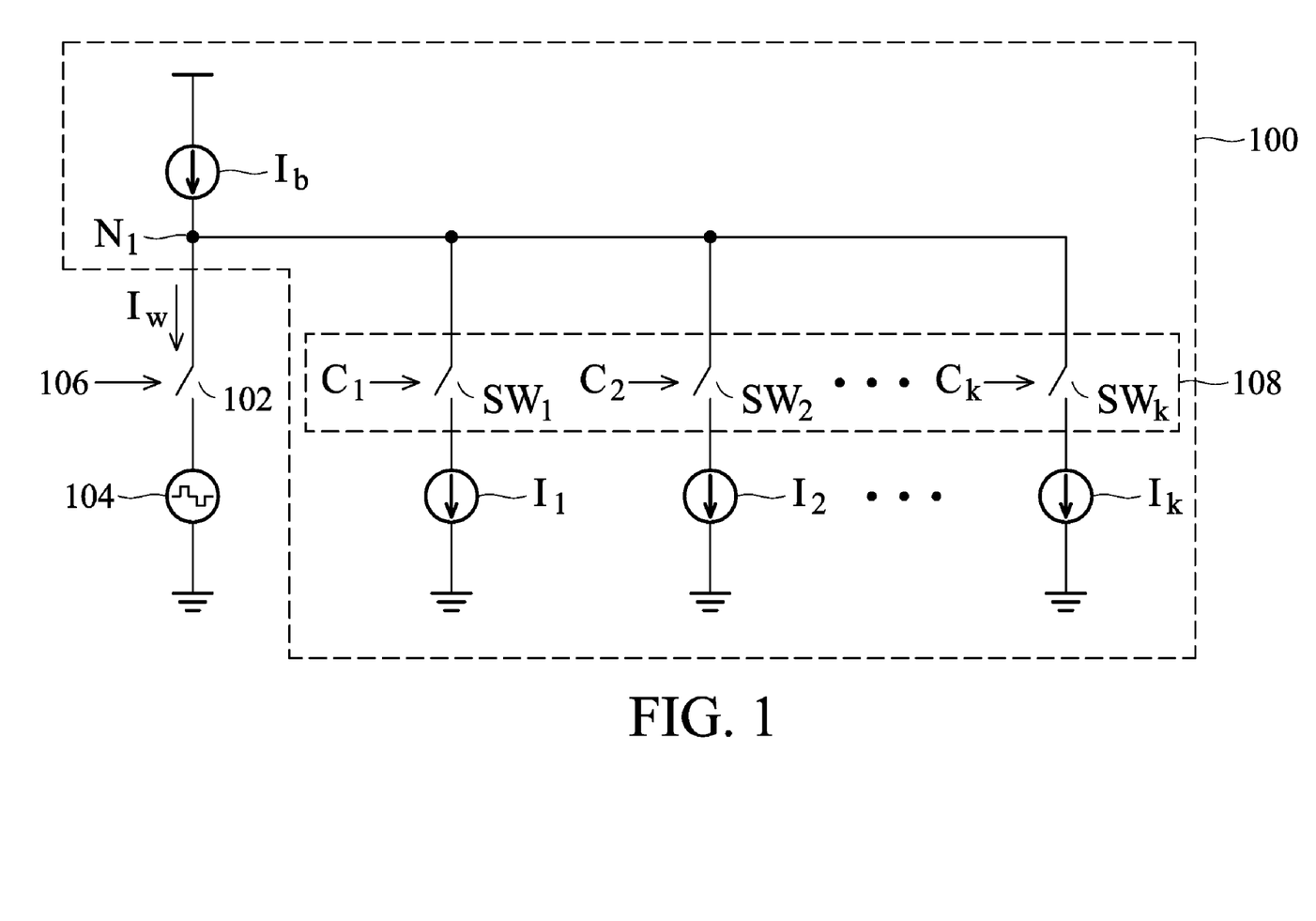
FIG. 1 depicts an exemplary embodiment of operating current generating circuits of the present disclosure.

FIG. 1 depicts an operating current generating circuit 100, a bit select switch 102 and a phase change storage element 104. The bit select switch 102 is coupled in series with the phase change storage element 104 and is controller by a signal 106. When the bit select switch 102 is turned on, an operating current $I_w$ flows through the phase change storage element 104. The operating current $I_w$ is generated by the operating current generating circuit 100.

The operating current generating circuit 100 comprises a current source $I_b$, a plurality of branch sinks $I_1 \sim I_k$, and a switching circuit 108. The switching circuit 108 comprises a plurality of switches $SW_1 \sim SW_k$ controlled by control signals $C_1 \sim C_k$, respectively. According to the control signals $C_1 \sim C_k$, the branch sinks $I_1 \sim I_k$ are selectively coupled to the output terminal $N_1$ of the current source $I_b$. Thus, the operating current $I_w$ is adjusted accordingly.

Figure 2:
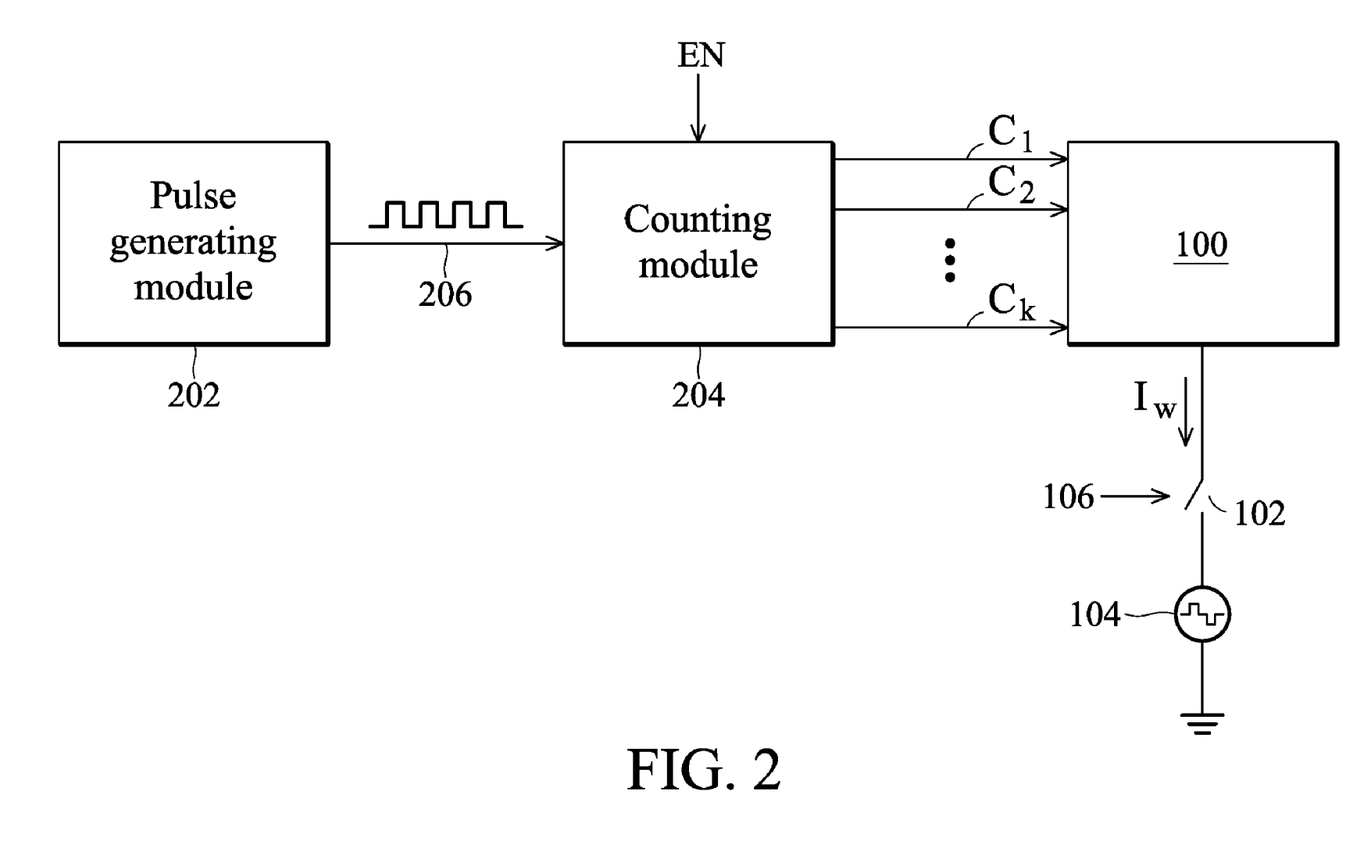
FIG. 2 depicts an exemplary embodiment of the phase change memories of the present disclosure.

FIG. 2 depicts an exemplary embodiment of the phase change memories of the present disclosure. As shown, the phase change memory comprises a pulse generating module 202 and a counting module 204. The counting module 204 generates control signals $C_1 \sim C_k$ controlling the switches $SW_1 \sim SW_k$ of the switching circuit 108 of the operating current generating circuit 100. The pulse generating module 202 outputs a pulse signal 206, oscillating between a high voltage level and a low voltage level, to the counting module 204. When enabled by a counting enable signal EN, the counting module 204 counts the amount of pulses of the pulse signal 206 and outputs the count result by a first set of digital data. As shown, the first set of digital data are the control signals $C_1 \sim C_k$.

The counting module 204 may count down or count up. Thus, the control signals $C_1 \ldots C_k$ may progressively decrease from 1 . . . 1 to 0 . . . 0, or progressively increase from 0 . . . 0 to 1 . . . 1. Because the switches $SW_1 \ldots SW_k$ of the switching circuit 108 of the operating current generating circuit 100 are controlled by the control signals $C_1 \ldots C_k$, the operating current $I_w$ may progressively increase or progressively decrease accordingly. In a crystallization case, the progressively increasing operating current $I_w$ disclosed in the application can easily transform the phase change storage element 104 to the crystalline phase. Compared with conventional techniques, the exemplary embodiments of the present disclosure uses an operating current $I_w$ with a much lower peak value to crystallize the phase change storage element 104.

Figure 3:
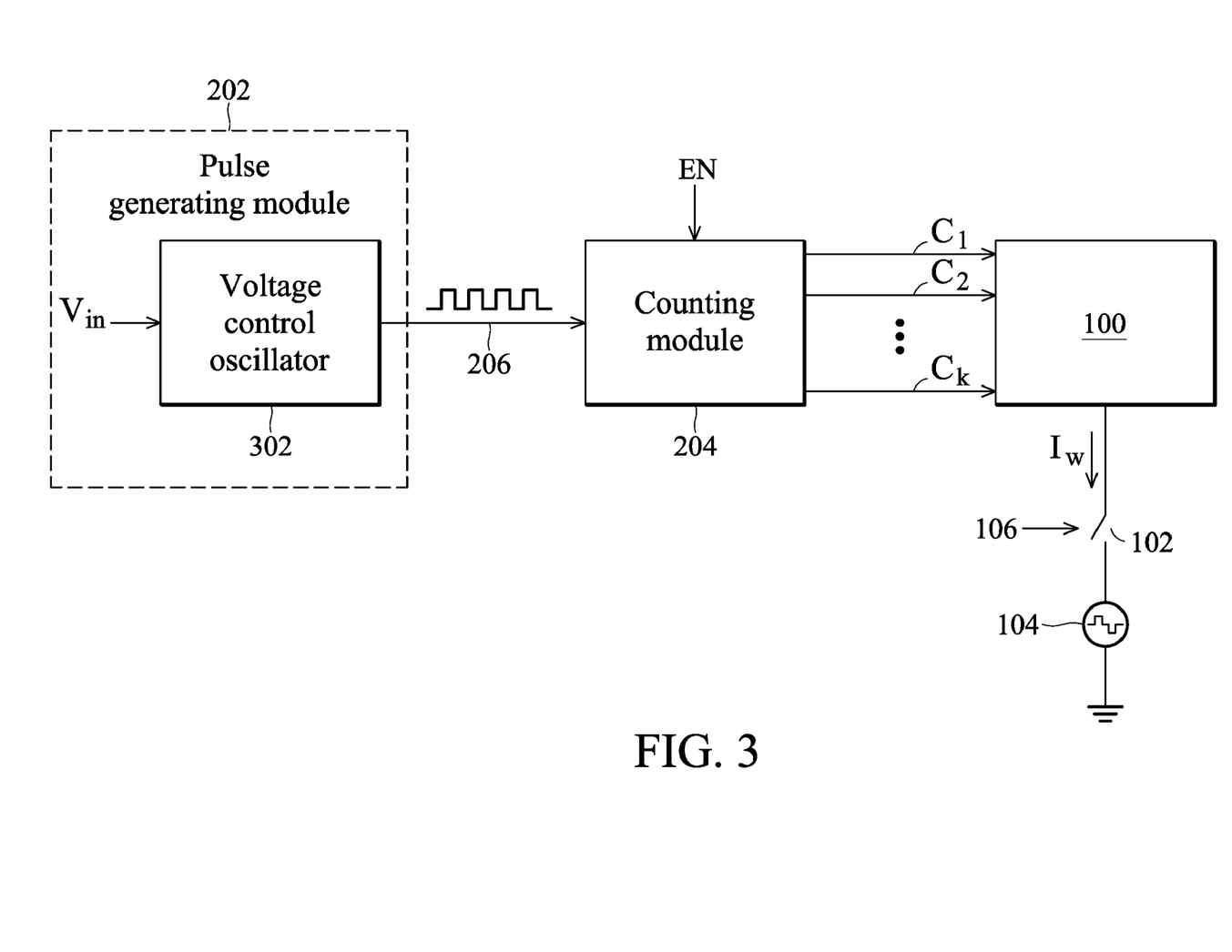
FIG. 3 depicts another exemplary embodiment of the phase change memories of the present disclosure.

FIG. 3 depicts another exemplary embodiment of the phase change memories of the present disclosure, wherein the pulse generating module 202 comprises a voltage control oscillator 302. The voltage control oscillator 302 adjusts the frequency of the pulse signal 206 according to a voltage value $V_{in}$. According to the change of the voltage value $V_{in}$, the decreasing/increasing speed of the count result ($C_1 \ldots C_k$) is changed. Therefore, the increasing/decreasing speed of the operating current $I_w$ is changed accordingly.

The phase change memory disclosed by FIG. 3 improves crystallization of the phase change storage element therein. By changing the voltage value $V_{in}$, the increasing/decreasing speed of the operating current $I_w$ may be adjusted to optimize crystallization of the phase change storage element 104.

Figure 4:
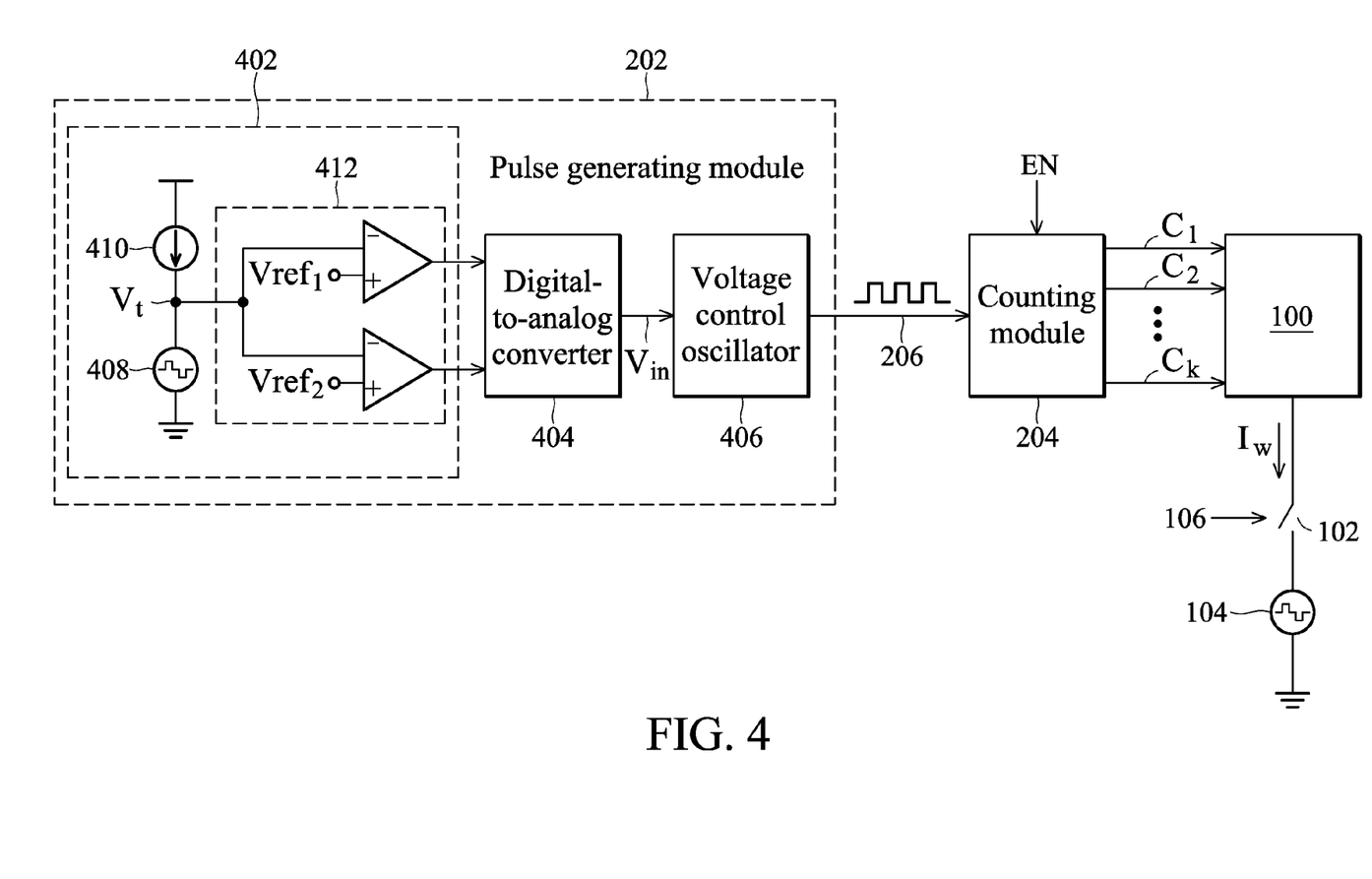
FIG. 4 depicts another exemplary embodiment of the phase change memories of the present disclosure.

FIG. 4 depicts another exemplary embodiment of the phase change memories of the present disclosure. As shown, the pulse generating module 202 comprises a verification circuit 402, a digital-to-analog converter 404 and a voltage control oscillator 406. The verification circuit 402 comprises a sample 408 of the phase change storage elements used in the phase change memory. In a test mode, a current source 410 generates a test current to flow through the sample 408 to change the phase of the sample 408. Then, in a verification mode, the current source 410 generates a read current to flow through the phase changed sample 408 to generate a voltage value $V_r$. The comparing circuit 412 compares the voltage value $V_r$ with reference voltages $V_{ref1}$ and $V_{ref2}$ to estimate the resistance of the sample 408. The comparing circuit 412 outputs a second set of digital data to represent the estimated resistance of the sample 408. The digital-to-analog converter 404 converts the second set of digital data to a voltage value $V_{in}$. The voltage value $V_{in}$ is sent to the voltage control oscillator 406 to generate the pulse signal 206 and to determine the oscillation frequency of the pulse signal 206.

Figure 5:
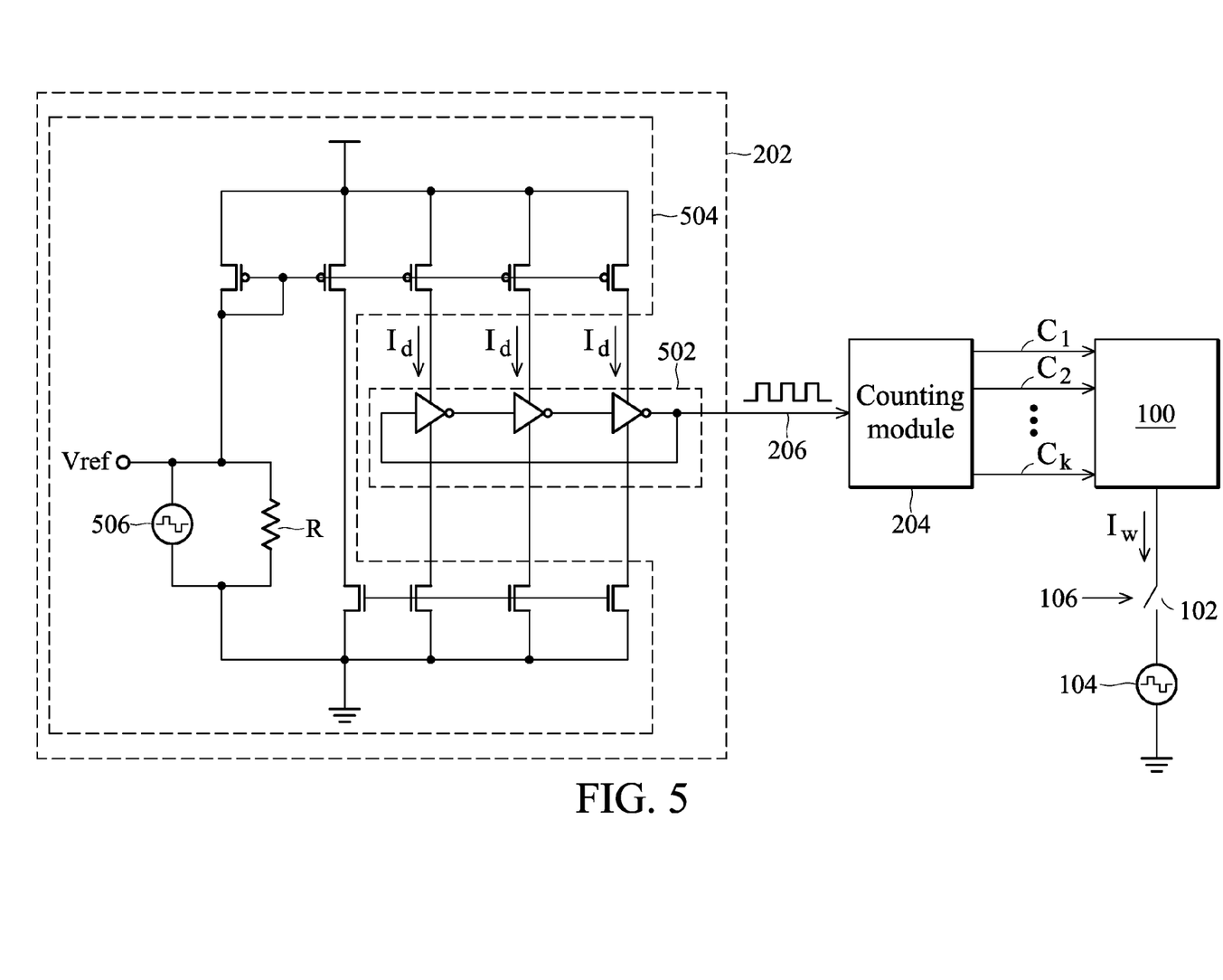
FIG. 5 depicts another exemplary embodiment of the phase change memories of the present disclosure.

FIG. 5 depicts another exemplary embodiment of the phase change memories of the present disclosure. As shown, the pulse generating module 202 comprises a plurality of inverters (shown in block 502) and a driver 504 for the inverters. Referring to block 502, the inverters are coupled in series, and the output of the last inverter is coupled to the input of the first inverter. The circuit shown in block 502 is designed to output the pulse signal 206. Referring to the driver 504, there is a sample 506 of the phase change storage elements of the memory. Before assembled in the driver 504, the sample 506 is processed by a test current to change its phase in advance. The phase changed sample 506 is then driven by a voltage $V_{ref}$. The voltage $V_{ref}$ is constant, and thus, the driving currents $I_d$ is mainly dependent on the resistance of the sample 506. As shown, the driving currents $I_d$ determines the oscillation frequency of the pulse signal 206, and the oscillation frequency of the pulse signal 206 determines the increasing/decreasing speed of the operating current $I_w$ of the phase change storage element 104. Thus, the resistance of the sample 506 affects the increasing/decreasing speed of the operating current $I_w$. Automatically, the operating current $I_w$ is adjusted to its ideal value which perfectly crystallizes the phase change storage element 104. The resistor R of the driver 504 is designed to maintain the driving currents $I_d$ so that the oscillation frequency of the pulse signal 206 is kept above a threshold value and the duty period of the operating current $I_w$ is within a reasonable length. The resistor R is optional.

Compared to FIG. 3, the sample 408 or 506 shown in FIG. 4 or 5 is designed to provide an operating current $I_w$ self-calibrating mechanism. In the cases of FIGS. 4 and 5, the operating current $I_w$ is automatically adjusted to an ideal form according to the resistance of the phase changed sample 408 or 506. The sample 408 or 506 is designed to model the crystallization capability of the phase change storage element 104. The self-calibrating mechanism optimizes the crystallization of the phase change storage element 104.

Figure 6:
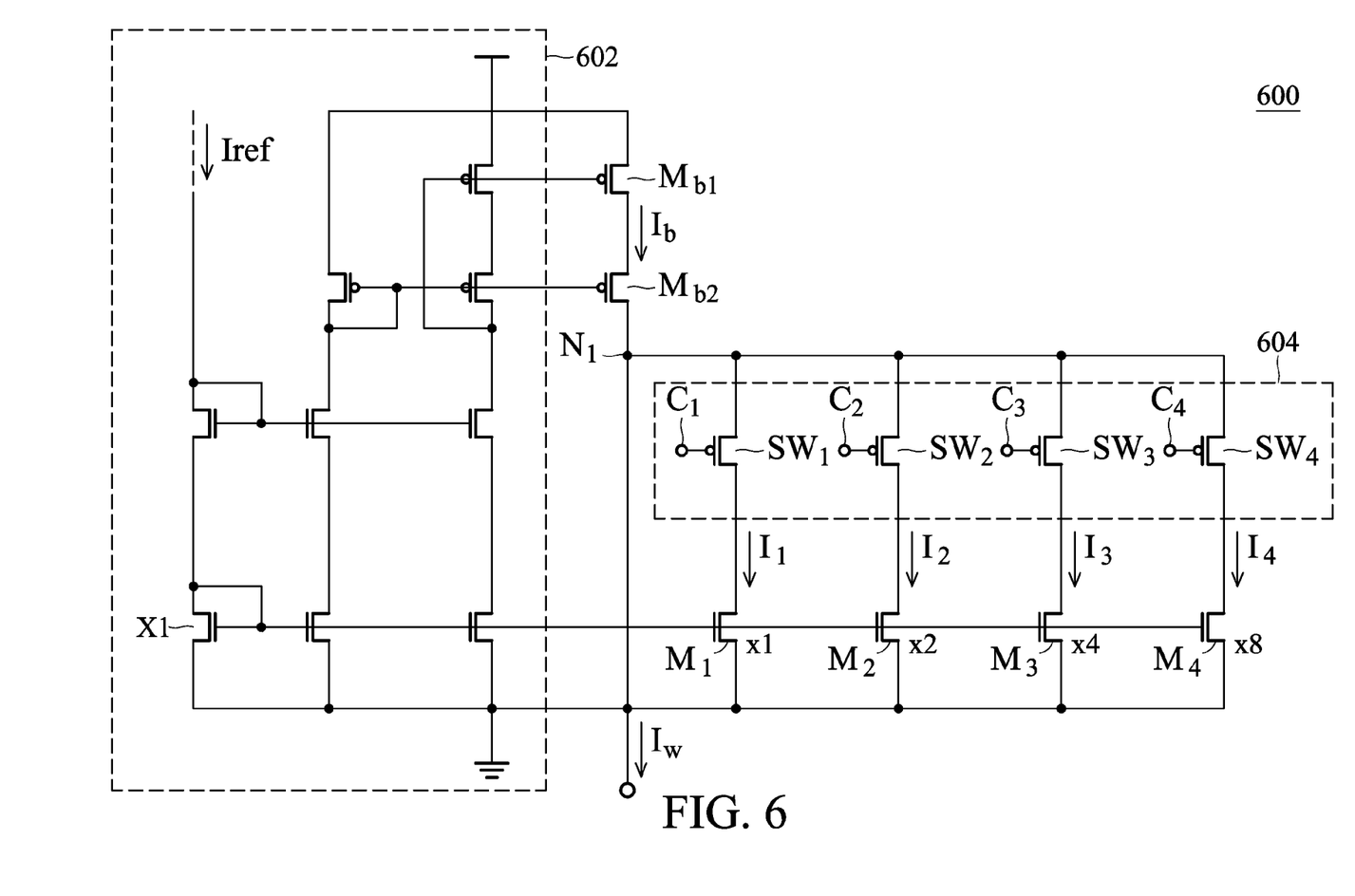
FIG. 6 depicts another exemplary embodiment of the operating current generating circuits of the present disclosure.

FIG. 6 depicts another exemplary embodiment of the operating current generating circuits of the present disclosure. The operating current generating circuit 600 comprises a bias circuit 602 biasing the transistors $M_{b1}$ and $M_{b2}$ to generate the current $I_b$. The operating current generating circuit 600 further comprises four transistors $M_1$, $M_2$, $M_3$ and $M_4$. The transistors $M_1$, $M_2$, $M_3$ and $M_4$ are biased by the bias circuit 602 to generate four braches $I_1$, $I_2$, $I_3$ and $I_4$ for the current $I_b$. The values of the braches $I_1$, $I_2$, $I_3$ and $I_4$ are dependent on a reference current $I_{ref}$ and the size of the transistors $M_1$, $M_2$, $M_3$ and $M_4$. In the embodiment shown in FIG. 6, the current $I_b$, the braches $I_1$, $I_2$, $I_3$ and $I_4$ and the reference current $I_{ref}$ follow a specific ratio: 16:1:2:4:8:1. The switching circuit 604 uses four switches $SW_1$, $SW_2$, $SW_3$ and $SW_4$ to selectively couple the transistors $M_1$, $M_2$, $M_3$ and $M_4$ to the node $N_1$. According to the states of the switches $SW_1$, $SW_2$, $SW_3$ and $SW_4$, the current $I_b$ may be decreased by the braches $I_1$, $I_2$, $I_3$ and $I_4$ and an operating current $I_w$ is generated. As shown, the switches $SW_1$, $SW_2$, $SW_3$ and $SW_4$ are controlled by control signals $C_1$, $C_2$, $C_3$ and $C_4$. In this exemplary embodiment, a high voltage level relates to a switch turn-on action, and a low voltage level relates to a switch turn-off action.

The circuit 600 can be applied in the exemplary embodiment shown in FIG. 4, wherein the counting module 204 may comprise an up counter, and an increasing voltage $V_{in}$ may accelerate the oscillation of the pulse signal 206 generated by the voltage control oscillator 406. A crystallization process is described in the following. In the test mode, the test current may be set to $I_b$ (the same as the current $I_b$ of FIG. 6), and attempt to crystallize the sample 408. In a following verification mode, the current source 410 outputs a read current to check the resistance of the phase changed sample 408, wherein the resistance of the phase changed sample 408 is reflected in the digital output of the verification circuit 402. When the crystallization of the sample 408 is not satisfactory, the resistance of the sample 408 is greater than a normal value. Thus, the verification circuit 402 outputs a low value digital data to pull down the voltage $V_{in}$. The lowered voltage $V_{in}$ slows down the oscillation of the pulse signal 206. Accordingly, the increasing rate of the digital data $C_1$, $C_2$, $C_3$ and $C_4$ (increasing from 0000 to 1111) is slowed down, and the decreasing rate of the operating current $I_w$ (decreasing from $16 \cdot I_{ref}$ to $1 \cdot I_{ref}$) is slowed down to optimize the crystallization of the phase change storage element 104. An operating current $I_w$ self-calibrating mechanism is accomplished.

In another case, the operating current generating circuit 600 may be applied in the exemplary embodiment shown in FIG. 5, wherein the counting module 204 may comprise an up counter. A crystallization process is described in the following. Before assembled into the driver 504, the phase change storage element sample 506 is tested by a test current having the same value as current $I_b$ in FIG. 6. Then, the phase changed sample 506 is assembled into the driver 504. When the crystallization of the sample 506 is not satisfactory, the resistance of the sample 506 is greater than a normal value. Thus, the driving current $I_d$ is pulled down and the oscillation of the pulse signal 206 is slowed down. Accordingly, the increasing rate of the digital data $C_1$, $C_2$, $C_3$ and $C_4$ (increasing from 0000 to 1111) is slowed down, and the decreasing rate of the operating current $I_w$ (decreasing from $16 \cdot I_{ref}$ to $1 \cdot I_{ref}$) is slowed down to optimize the crystallization of the phase change storage element 104. An operating current $I_w$ self-calibrating mechanism is accomplished.

Figure 7A:
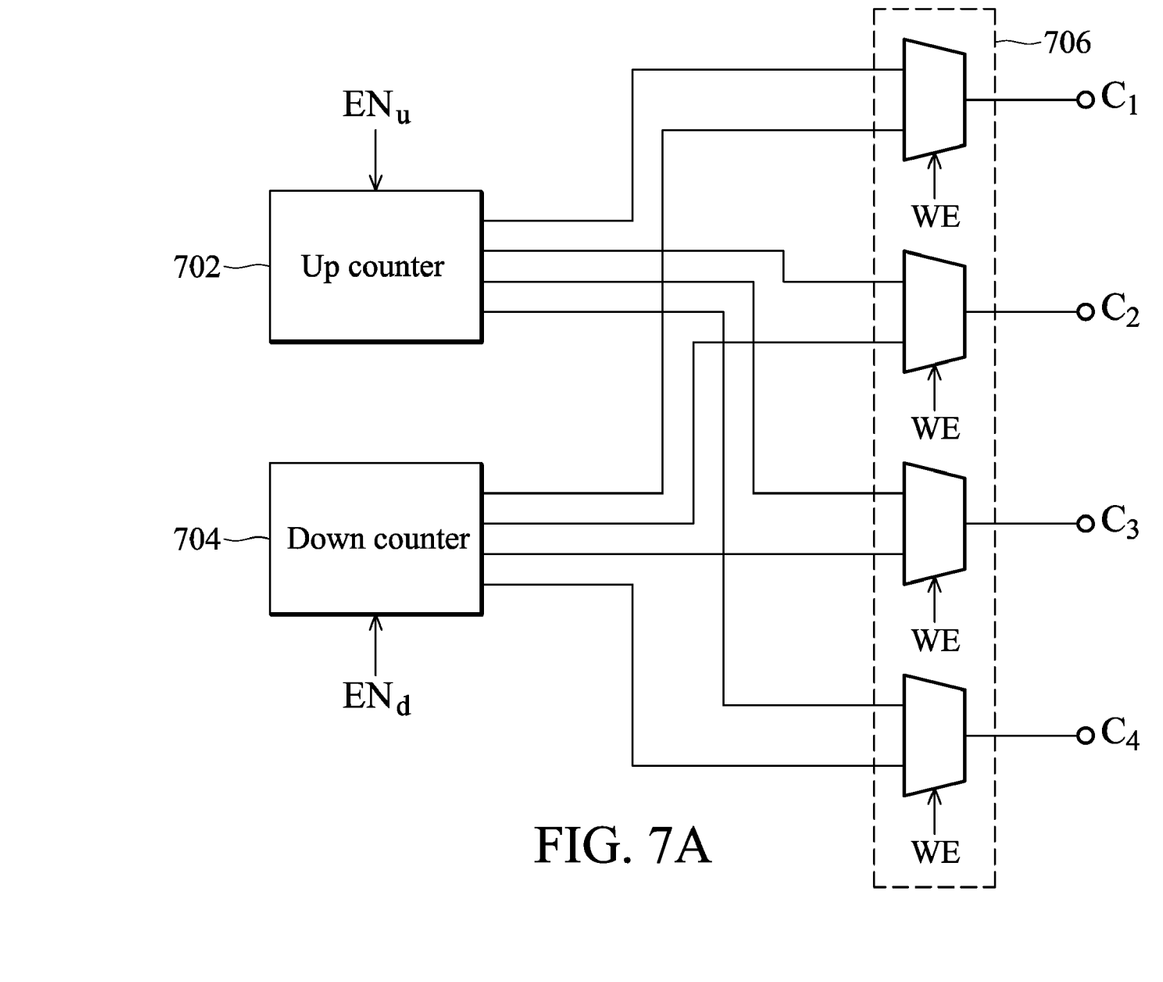
FIG. 7A depicts an exemplary embodiment of the counting modules of the present disclosure.

FIG. 7A depicts an exemplary embodiment of the counting module 204, which comprises an up counter 702 and a down counter 704 enabled by counting enable signals $EN_u$ and $EN_d$, respectively. The multiplexer circuit 706 outputs the up counting result or the down counting result according to a selection signal WE.

Figure 7B:
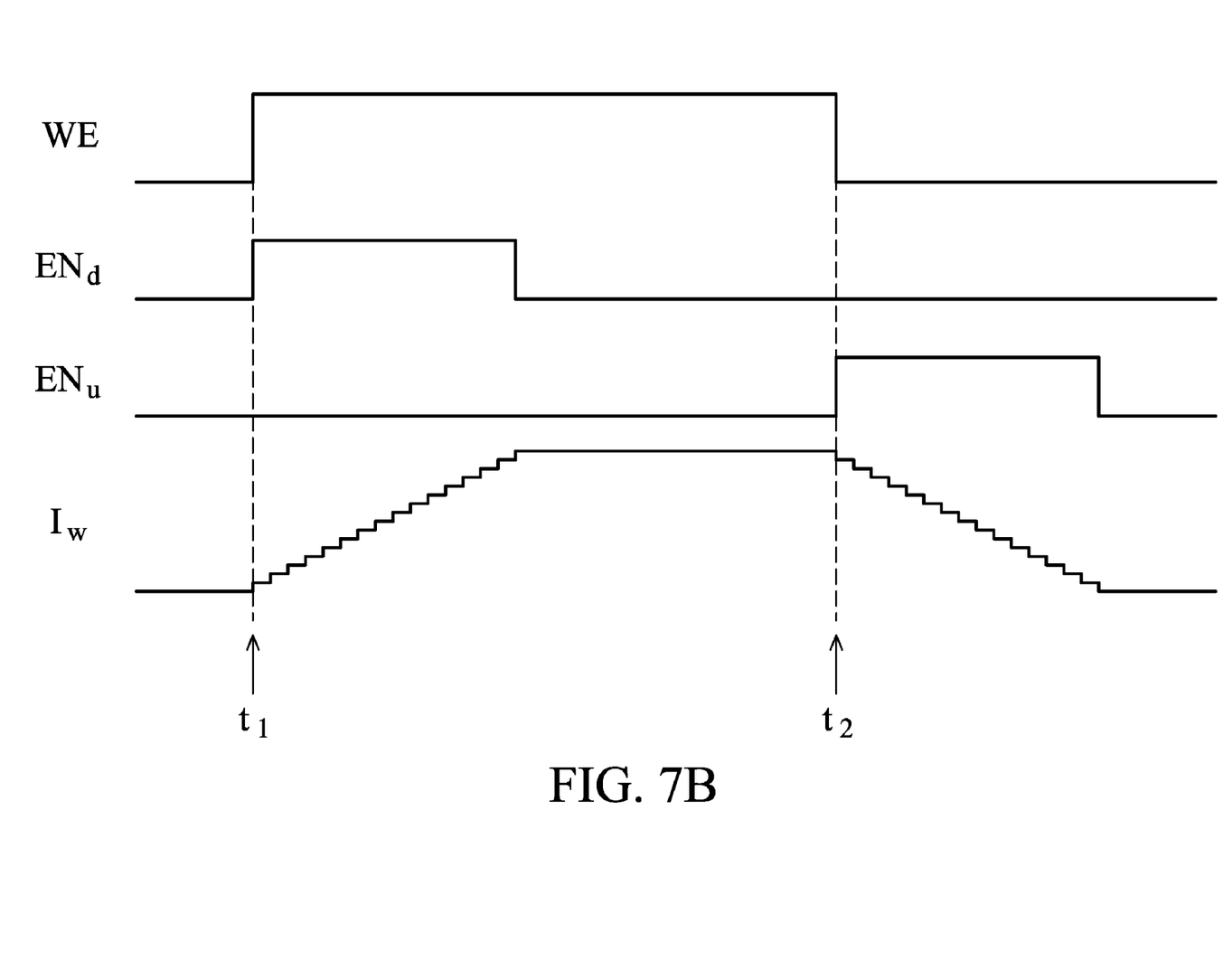
FIG. 7B shows waveforms of signals WE, $EN_u$ and $EN_d$, and the operating current $I_w$.

When the operating current generating circuit 600 of FIG. 6 and the counting module of FIG. 7A are applied in the phase change memory of FIG. 2 and the bit select signal 106 enables the bit select switch 102, the signals WE, $EN_u$ and $EN_d$, and the operating current $I_w$ may work as the waveforms shown in FIG. 7B. At time index $t_1$, the selection signal WE is switched to a high voltage level and the counting enable signal $EN_d$ enables the down counter 704, thus, the circuit 706 outputs decreasing data (the control signals $C_1$, $C_2$, $C_3$ and $C_4$ are decreased from 1111 to 0000). The switches $SW_1$, $SW_2$, $SW_3$ and $SW_4$ of the switching circuit 604 of FIG. 6 are turned on/off according to the decreasing control signals $C_1$, $C_2$, $C_3$ and $C_4$ to result in a gradually increasing operating current $I_w$. At time index $t_2$, the selection signal WE is switched to a low voltage level and the counting enable signal $EN_u$ enables the up counter 702, thus, the circuit 706 outputs increasing data (the control signals $C_1$, $C_2$, $C_3$ and $C_4$ are increased from 0000 to 1111). The switches $SW_1$, $SW_2$, $SW_3$ and $SW_4$ of the switching circuit 604 of FIG. 6 are turned on/off according to the increasing control signals $C_1$, $C_2$, $C_3$ and $C_4$ to result in a gradually decreasing operating current $I_w$.

Referring to the waveform of the operating current $I_w$ shown in FIG. 7B, a phase change memory with gradually increasing/decreasing operating current is provided. The present disclosure improves the crystallization of the phase change storage elements. Furthermore, the it discloses techniques controlling the gradually increasing or decreasing speed of the operating current $I_w$.

While the present disclosure has been described by way of exemplary embodiments, it is to be understood that the disclosed embodiments are not limitative. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A phase change memory, comprising
  a switching circuit routing branch currents, comprising a plurality of switches, selectively coupling a plurality of branch paths to an output terminal of a current source;
  a phase change storage element;
  a bit select switch, controlling the conduction between the phase change storage element and the output terminal of the current source;
  a pulse signal generating module, outputting a pulse signal; and
  a counting module, enabled to count the number of pulses of the pulse signal, and outputting a first set of digital data to represent a count result,
  wherein the first set of digital data are coupled to the switching circuit to control the switches therein.

2. The phase change memory as claimed in claim 1, wherein the pulse signal generating module comprises a voltage control oscillator.

3. The phase change memory as claimed in claim 1, wherein the pulse signal generating module comprises:
  a verification circuit, verifying resistance of a phase change storage element sample that had been processed by a test current and outputting a second set of digital data to represent the verified resistance;
  a digital-to-analog converter, converting the second set of digital data to a voltage signal; and
  a voltage control oscillator, outputting the pulse signal according to the voltage signal.

4. The phase change storage element as claimed in claim 1, wherein the pulse signal generating module comprises:
  a plurality of inverters that are coupled in series to generate the pulse signal, wherein the output of the last inverter is fed back to the first inverter; and
  a driver for the inverters, generating driving currents driving the inverters, wherein the driving currents are generated according to resistance of a phase change storage element sample that had been processed by a test current.

5. The phase change memory as claimed in claim 1, wherein each of the switches comprises a control terminal and is turned on when the control terminal is at a high voltage level and is turned off when the control terminal is at a low voltage level.

6. The phase change storage element as claimed in claim 5, wherein the counting module comprises a down counter, operative to increase an operating current flowing through the phase change storage element.

7. The phase change storage element as claimed in claim 5, wherein the counting module comprises an up counter, operative to decrease an operating current flowing through the phase change storage element.

* * * * *